United States Patent [19]

Kessler et al.

[11] Patent Number: 5,619,245

[45] Date of Patent: Apr. 8, 1997

[54] MULTI-BEAM OPTICAL SYSTEM USING LENSLET ARRAYS IN LASER MULTI-BEAM PRINTERS AND RECORDERS

[75] Inventors: David Kessler, Rochester; John M. Simpson, Jr., Webster, both of N.Y.

[73] Assignee: Eastman Kodak Company, Rochester, N.Y.

[21] Appl. No.: 283,003

[22] Filed: Jul. 29, 1994

[51] Int. Cl.⁶ .................. B41J 2/47; B41J 2/435
[52] U.S. Cl. ............................. 347/241; 347/237
[58] Field of Search ....................... 347/241, 244, 347/137, 134, 237; 355/67

[56] References Cited

U.S. PATENT DOCUMENTS

| | | | |
|---|---|---|---|
| 4,428,647 | 1/1984 | Sprague et al. | 350/167 |
| 4,516,832 | 5/1985 | Jain et al. | 350/96.24 |
| 4,520,472 | 5/1985 | Reno | 369/112 |
| 4,815,067 | 3/1989 | Webster et al. | 369/97 |
| 4,848,879 | 7/1989 | Nishimura et al. | 350/353 |
| 4,939,630 | 7/1990 | Kikuchi et al. | 362/268 |
| 4,974,919 | 12/1990 | Muraki et al. | 350/6.6 |
| 5,130,852 | 7/1992 | Hamanaka | 359/741 |
| 5,153,773 | 10/1992 | Muraki et al. | 359/619 |
| 5,237,367 | 8/1993 | Kudo | 355/67 |
| 5,305,022 | 4/1994 | Ota et al. | 346/108 |

FOREIGN PATENT DOCUMENTS

92/01405  7/1992  WIPO.

*Primary Examiner*—Benjamin R. Fuller
*Assistant Examiner*—Thinh Nguyen
*Attorney, Agent, or Firm*—Nelson A. Blish

[57] ABSTRACT

A multi-beam laser printer for printing on light-sensitive thermal media where a monolithic array of independently modulated diode lasers is used to reduce the size of the printer. A closely spaced array of printing spots is produced from the separate diode lasers using two lenslet arrays having power in the array direction. To correct for non-straightness of the laser array, an optical arrangement is used to conjugate the far field of the lasers in a direction perpendicular to the array direction of the printing plane so that the laser array produces a straight line of printing spots on the light-sensitive medium.

11 Claims, 6 Drawing Sheets

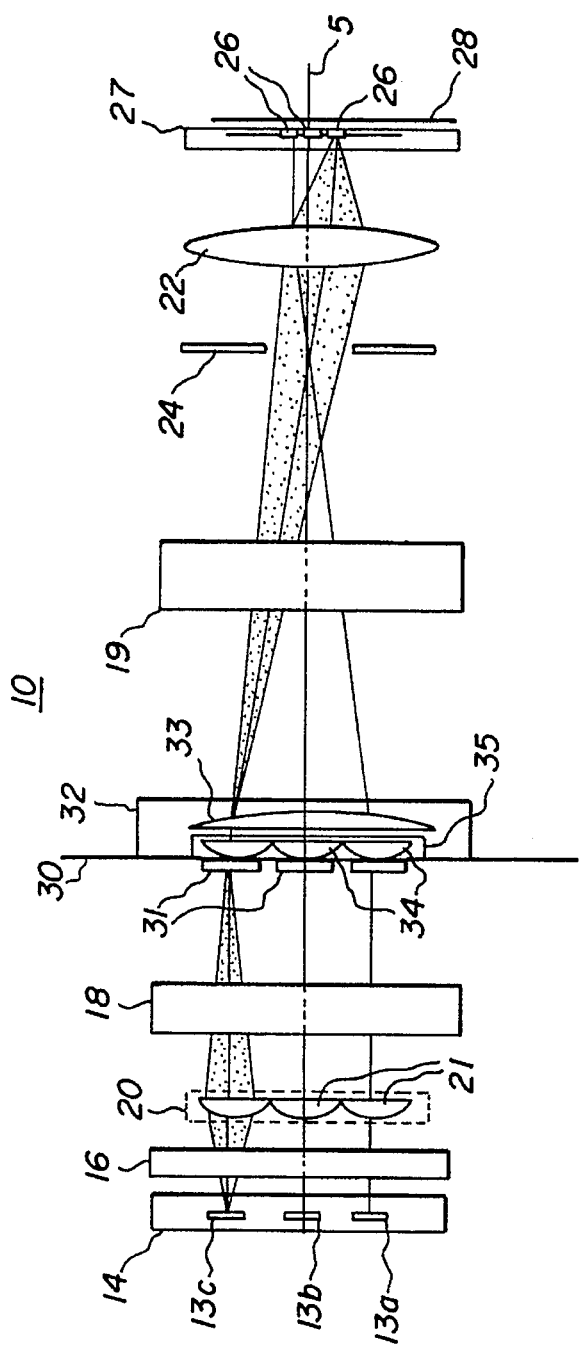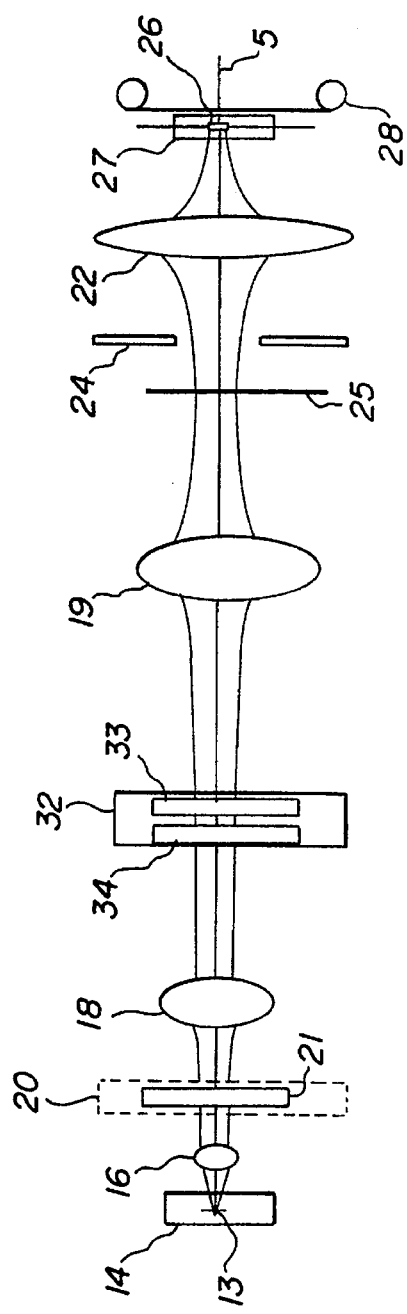
FIG. 2a
FIG. 2b

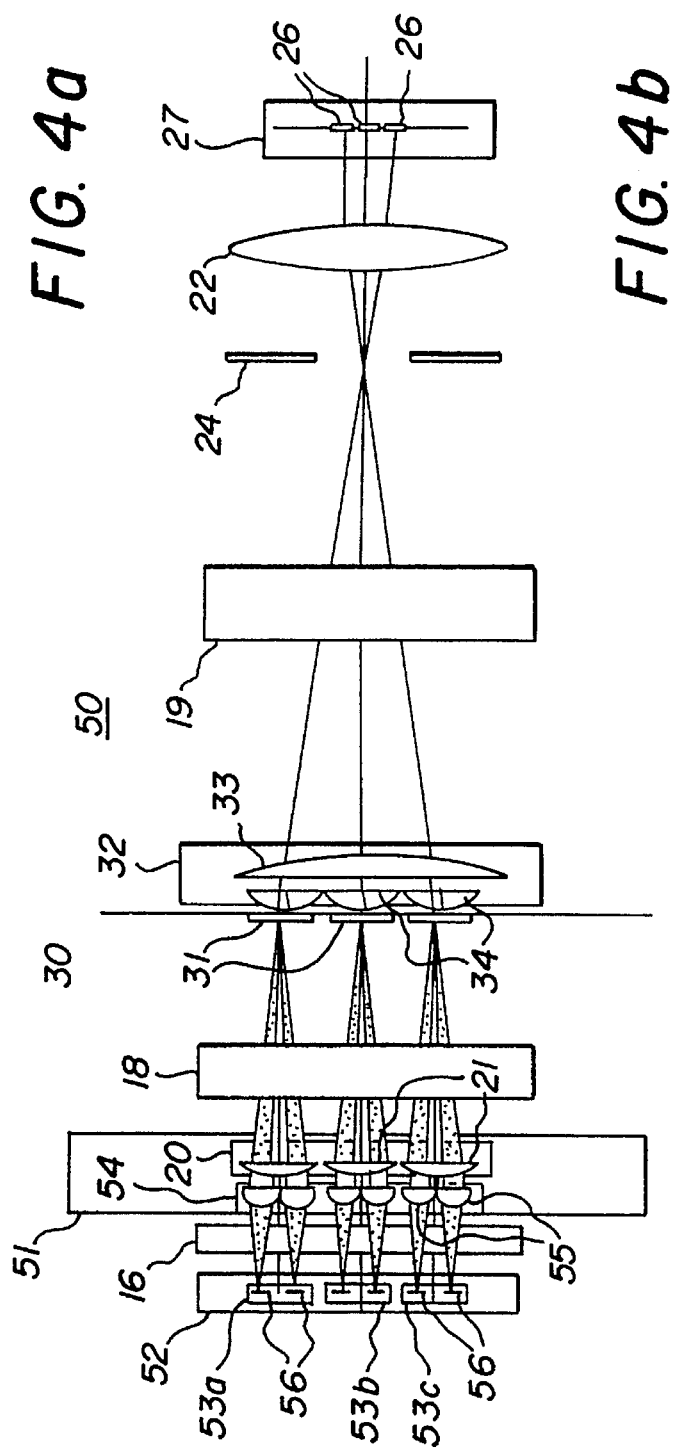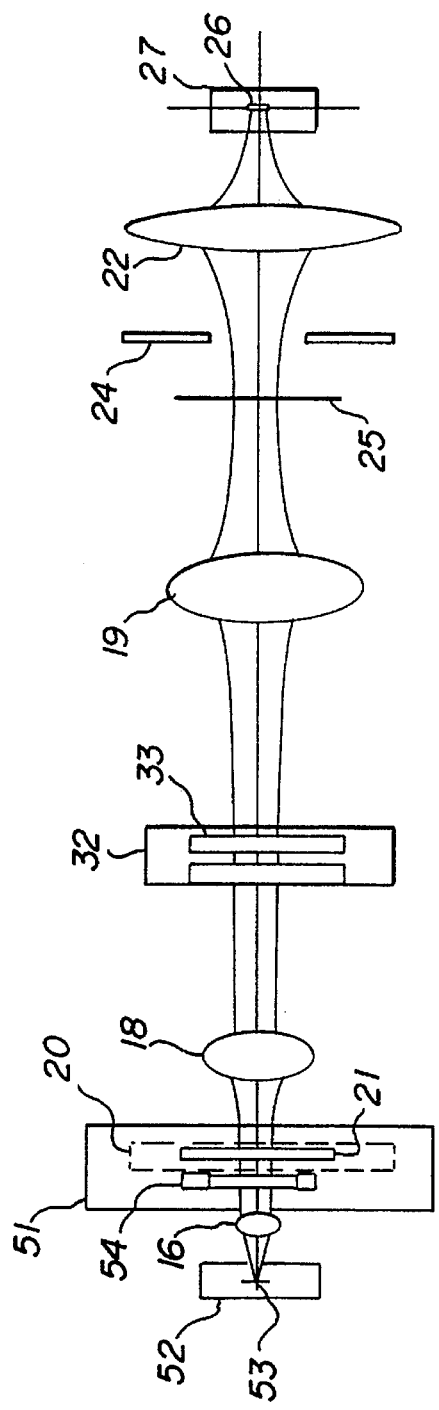

MULTI-BEAM OPTICAL SYSTEM USING LENSLET ARRAYS IN LASER MULTI-BEAM PRINTERS AND RECORDERS

FIELD OF THE INVENTION

The present invention relates to techniques for efficiently using diode laser arrays in laser printers and recorders, and more particularly, to the use of lenslet arrays with diode laser arrays in laser multi-beam printers and recorders.

BACKGROUND OF THE INVENTION

International Application number WO 93/03481, issued to Lasor Limited, GB, inventor: John Brian Baker, discloses a recording apparatus which uses a laser array and a lenslet array. The system has a collimator lens in front of the laser array and one lenslet array at an intermediate image plane. This collimator is required to have a high numerical aperture in order to collect the laser light. This system is primarily used with an array of single-mode diode lasers spaced 100 micrometers center-to-center operated at relatively low power. For a ten-channel recorder Bakers' total array size would be 1 mm. However, high power diode laser arrays are typically 10 mm long and the diodes are separated by typically 1 mm to reduce thermal cross-talk. A lens which collects the highly divergent laser beams over 10 mm of field is expensive and difficult to make. In addition, this system disclosed by Baker is not efficient as it does not have a field lens at the intermediate image plane and it does not address the serious problem of array deviation from straightness which is an inherent problem especially for large high power arrays.

U.S. Ser. No. 986,207, filed Dec. 7, 1992, discloses means for using diode laser arrays in multi-beam printers and recorders. These means include a lenslet array which has power in the array direction and converts the light from the laser array into a closely packed ensemble of printing spots, and includes means for collecting and shaping the beams in the cross-array direction.

SUMMARY OF THE INVENTION

The present invention provides cost-effective arrangements and a method for using diode laser arrays in laser printers and recorders, and more particularly, to the use of lenslet arrays with diode laser arrays and the use of optical means for correcting the deviation from straightness of diode laser arrays in multi-beam laser printers or recorders.

The present invention provides improved means for collecting and shaping the laser light in the array direction which include an additional lenslet array and which provide higher efficiency than the previously disclosed systems. In addition, optical means in the cross-array direction are disclosed which first reduce the large divergence of the diode array in the cross-array direction before any collection is done in the array direction. In addition, optical means to correct for deviations from straightness of the diode laser arrays are disclosed. In addition, optical means are disclosed for overlapping diode lasers for protection against diode laser failure. Also, optical means are disclosed for correcting for diode laser array misregistration with the lenslet array. Further, optical means are disclosed for creating a two-dimensional array of printing spots from a one-dimensional laser array. In addition, optical means are disclosed for creating an array of printing spots with different sizes from a one-dimensional laser array.

The present invention provides a multi-beam laser printer for printing onto a light-sensitive medium comprising a plurality of diode lasers formed into a diode laser array, each diode laser generates a separately modulated diverging light beam having a predetermined intensity at any instant in time and a predetermined emitting aperture and a printing lens having an entrance pupil for forming the light beams from the diode laser array which enters through the center of the entrance pupil onto a light-sensitive medium as an array of spots of predetermined intensities. Optical means are further included for reducing the divergence of the light beams from the plurality of diode lasers by a predetermined amount in the direction perpendicular to the array direction and a lenslet array having a separate lenslet for each light beam for directing each of the light beams in the array direction towards the object plane of the printing lens to form more uniform distribution of light in the array direction. A second lenslet array at a distance from the first lenslet array for imaging the first lenslet array into the entrance pupil of the printing lens in the array direction.

BRIEF DESCRIPTION OF THE DRAWINGS

Other features and advantages will become apparent upon reference to the following description of the preferred embodiment when read in light of the attached drawings.

FIG. 2a is the cross-sectional view of the optical system in the array direction or top plan view thereof;

FIG. 2b is the cross-sectional view in the cross-array direction or a side elevational view thereof;

FIG. 4a illustrates the top plan view of the optical system in the array direction for a system according to a preferred embodiment in which each of the diode lasers comprise a sub-array of diode lasers;

FIG. 4b illustrates the elevational view in the cross-array direction for a system according to a preferred embodiment in which each of the diode lasers comprise a sub-array of diode lasers;

DETAILED DESCRIPTION OF THE INVENTION

While the invention will be described in connection with a preferred embodiment, it will be understood that it is not intended to limit the invention to that embodiment. On the contrary, it is intended to cover all alternatives, modifications and equivalents as may be included within the spirit and scope of the invention as defined by the appended claims.

In the following description of the various embodiments of the present invention, corresponding elements having the same function in the various figures are given the same designation numbers.

We use the term "array direction" to indicate the direction parallel to the line connecting all of the diode lasers of the array. We use the term "cross-array direction" to indicate the direction perpendicular to both the optical axis and to the array direction.

Though diode laser radiant power is typically in the infrared and is not visible, we will still refer to it as "light".

The numerical aperture (NA) of the beam is defined as the sine of half the beam divergence angle at a level of 13.5% of its maximum irradiance.

We use the term "printing" or "recording" to indicate, in general, the process of affecting the irradiated medium by the laser light. This includes, for example, laser thermal dye transfer, laser ablation, writing on thermally sensitive printing plates, marking of metals, re-coding on photographic film, re-coding on photoconducting medium in an electrophotographic machine etc.

Figure 1:
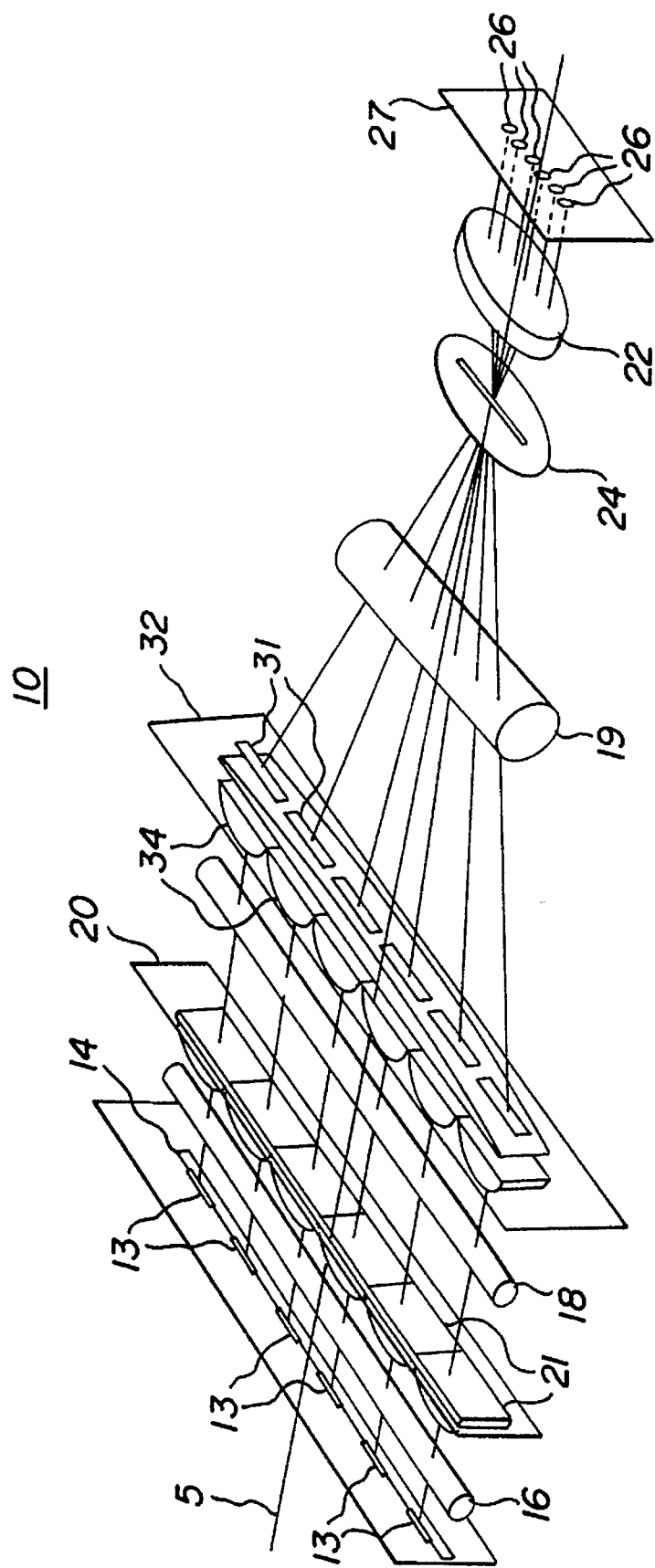
FIG. 1 is a perspective view of an optical system for use with a diode laser array in a laser multi-beam printer in accordance with an embodiment of the present invention.

Referring now to FIGS. 1 and 2a–b, FIG. 1 shows a perspective view of an optical arrangement 10 in accordance with the preferred embodiment of the present invention for use in a laser multi-beam printer. FIG. 2a shows a top plan view in the array direction according to the preferred embodiment and FIG. 2b shows the cross-sectional view in the cross-array direction of the preferred embodiment.

Diode laser array 14 is an array of independently modulated diode lasers 13. Because the diode lasers operate at high power, they cannot be placed in a closely packed formation due to potential thermal cross-talk. Thus, the active areas of the diode lasers are separated and each one occupies a small fraction of the array length. Each diode laser 13 is typically a multi-mode diode laser with an emitting area width of about 1 micrometer and emitting area length of 100 micrometers to 200 micrometers. It is clear to a practitioner of the art that the diode laser could also be single-mode diode laser or could be of the kind commonly referred to as a phase coupled laser in which the diode laser is actually a closely packed sub-array of single-mode diode lasers optically coupled to emit a coherent beam. Typically, a multi mode diode is used with divergence angles of 11 degrees at the Full Width Half Maximum (FWHM) level in the array direction and 30 degrees FWHM in the cross-array direction. The numerical aperture (NA) of the beam is typically 0.1 in the array direction and 0.5 in the cross-array direction. Laser array 14 is typically made of 10 to 20 diode laser elements 13. For purposes of illustration, FIG. 2a shows only three diode laser elements: 13a, 13b, and 13c. Each diode laser element emits about 1 watt of power in the near infrared with the wavelength between 750 nm to 900 nm.

Diode laser array 14 is typically 10 mm in length. Assuming it is made of 10 diode laser elements 13, then the center-to-center distance between the diode lasers is 1 mm. It is difficult to collect the light from a source which is 10 mm wide and has an NA of 0.5. Note that a microscope objective with NA=0.5 typically has a field of only a fraction of a millimeter cylindrical lens 16 is, therefore, used to first reduce the divergence of the beam in the cross-array direction. Cylindrical lens 16 could also take the form of a fiber lens, that is a fiber optic used as a lens as shown. Other cylindrical lenses can be used such as the one described by James Snyder et al in "Fast Diffraction Limited Cylindrical Microlens", Applied Optics, Vol. 30, No. 10, pp. 2743–2747(1991). Cylindrical lens 16 typically collimates the diode laser elements 13 in the cross-array direction to maximize the efficiency of the binary optics lenslet array 20.

It is difficult to image the array directly onto the medium because the optics have to accommodate the full length of the array, which is typically 10 mm, with NA=0.1. To reduce the demands on the printing lens 22 we take advantage of the fact that only a small portion of the full length of the array is emitting light. Namely, the array has a low "fill factor". A lenslet array 20 is placed following cylindrical lens 16. The number of lenslets 21 in the lenslet array 20 equals the number of diode laser elements 13. The lenslets 21 have power in the array direction and substantially no power in the cross array direction. There are different kinds of lenslets arrays 20. They can be small, refractive lenses arranged in an array, or each lenslet can be broken into zones small enough to become a diffractive lenslet which can be made by using binary optics methods. Binary optics were disclosed by Gary J. Swanson and Wilfried B. Veldcamp in U. S. Pat. No. 4,895,790. They are made on optical glass using microlithographic techniques commonly used for etching into silicon substrates. The elements produced by their methods are commonly referred to as "binary optics". Though the name may suggest the use of two levels, in effect they are commonly made as 4- 8-, or 16- level elements. The registration of the lenslet array 20 and the diode laser 13 in the array direction is very critical to producing an even pitch at the medium plane. It is a further aspect of this invention to use binary optics in multi-beam laser printers because they can be made to register very accurately with the diode laser array since both the diode array and the lenslets are made with microlithographic masks.

The lenslet array 20 images each of the diode lasers to produce an intermediate image of the array with a magnification factor "m", where, for example, m=–10. The images of the diode lasers constitute a closely packed array of spots. The diode laser image 31 extends 1 mm in the array direction and their centers are separated by the same distance of 1 mm as the diode laser elements 13. The numerical aperture at intermediate image plane 30 is given by the diode lasers NA, divided by the magnification ratio, namely the NA at intermediate image plane 30 is given by NA=0.1. This intermediate image plane 30 is the object plane for the printing lens 22. Printing lens 22 is then used to form the image on intermediate image plane 30 onto the medium plane 28. The printing lens 22 must cover the field of 10 mm but at the very low NA of 0.01.

We continue the description of the beams propagation in the array direction as shown in FIG. 2a and ignore for now elements 18 and 19 which will be discussed later.

The beams from the different diode laser elements 13 are substantially parallel to each other, at the intermediate image plane 30. A field lens 33 diverts the beams at the intermediate image plane 30 so they pass through the center of the entrance pupil 24.

Another lenslet array 35 comprised of lenslets 34 is needed to fully correct for the vignetting. Each of the lenslets 34 in this second lenslet array 35 images a corresponding lenslet 21 in the first array into the entrance pupil 24 of printing lens 22. Without lenslets 34, light from the edge of the diode laser elements 13, going to the edge of diode laser image 31 would be vignetted at entrance pupil 24. Note that field lens 33 and field-lenslet array 35 is comprised of lenslets 34, shown separately for clarity, can be implemented in binary optics on one surface of second lenslet array 32 which is substantially co-located at intermediate image plane 30 with diode laser images 31.

Printing lens 22 de-magnifies the array of image spots at intermediate image plane 30 by about −1/40. Thus, the printing spots 26 at the medium plane 28 are separated by 1/40 mm, namely by 25 micrometers. Note also that the entrance pupil 24 of printing lens 22 can be designed to be at the front focal plane of printing lens 22 so that the beams at the printing plane 27 are substantially parallel to each other and perpendicular to the printing medium 28 creating an "image-telecentric system". This condition is very common and widely used in optical systems for applications in which geometric fidelity of the image is important, such as map production or microlithography. An image-telecentric system ensures that a focus error in the printing medium 28, with respect to the medium plane 27 will not effect the separation of the printing spots 26.

It is important to have good registration between lenslets 21 and diode laser elements 13. A displaced lenslet 21 causes a displacement of the corresponding diode laser image 31 at intermediate image plane 30, and consequently a displacement of the printing spots 26 which results in uneven spacing (pitch) of the printed spots. Changing thermal conditions which might occur when the laser operates at other than its designed temperature could induce misregistration between the lenslet array 20 and the diode laser array 14. Another aspect of this invention is the method of correcting this misregistration by slightly rotating lenslet array 20 about optical axis 5 increasing the apparent spacing of lenslets 21 from the perspective of the diode laser elements 13. This slight rotation allows better registration of lenslet array 20 with the diode laser array 14 during the packaging process. It should also be noted that because cylindrical lens 16 and lenslet array 20 are close to the diode laser array 14, they may be mounted within the laser package.

The beams in the cross-array direction for the present embodiment are essentially on axis, and behave as single-mode laser beams as shown in FIG. 2b. Lens elements 18 and 19 have power substantially only in the cross-array direction and relay the beams in the cross-array direction to the entrance pupil 24 in such a way that their printing spots 26 are at the printing plane 27. We typically want the size of the printing spots 26 in the cross-array direction to be about half their size in the array direction so as to increase the power density at the medium. Note that the printing plane 27 is not at the back focal plane of printing lens 22. The printing plane 27 is displaced from the back focal plane of printing lens 22 by the focal distance of the printing lens 22 divided by the magnification, so for a focal length of 8 mm, the printing medium 27 is removed from the back focal plane of printing lens 22 by 8/40=0.2 mm. The printing spots 26 in the cross-array direction must be formed by lens elements 18 and 19 at a plane 25, which is displaced from the entrance pupil 24, in order to permit printing lens 22 to project the waists at the printing spots 26 at the printing medium 28. There are many solutions for lens elements 18 and 19 which will convert substantially collimated light from cylindrical lens 16 into a waist with the desired FWHM of about 12 micrometers at the printing plane 27.

Figure 3A:
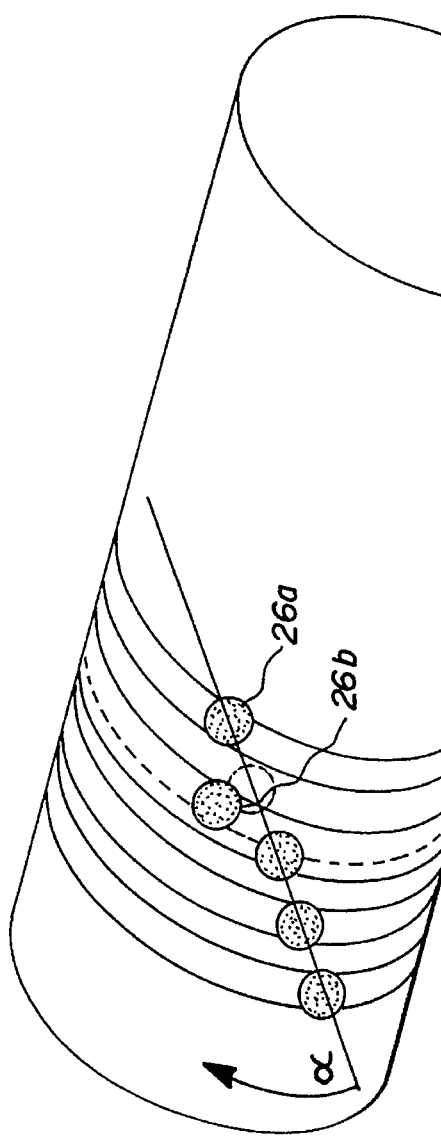
FIG. 3a illustrates the effect of a non-aligned array on the printing quality of an image produced on a rotating drum.
Figure 3B:
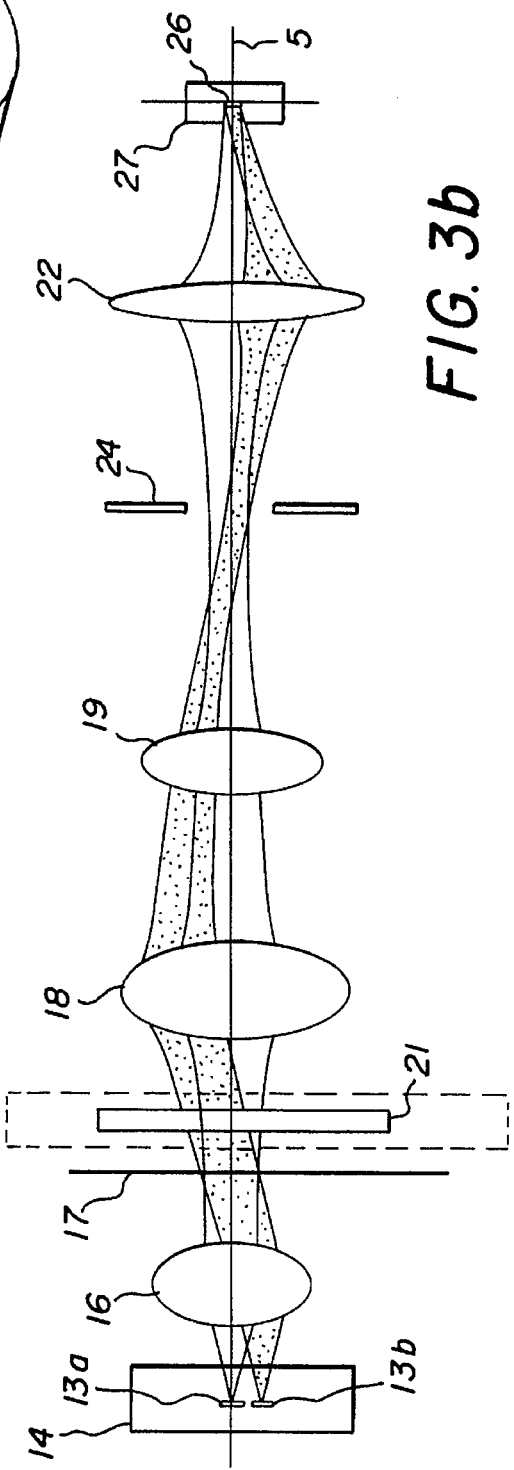
FIG. 3b is a cross-sectional view of the optical system according to the preferred embodiment illustrating its ability to correct for the non-aligned spots or beams of the diode laser array.

It is common in multi-beam printers to rotate the array of printing spots 26 about the optical axis 5 shown in FIG. 3b so that an angle $\alpha$ is formed between the linear diode laser array 14 and the direction of motion 15 of the printing medium 28. When the diode laser array 14 is straight and its diode laser elements 13 are evenly spaced, the printing tracks will also be evenly spaced. When a printing spot 26b is displaced from its nominal location as shown in FIG. 3a, the printing tracks are unevenly spaced and a noticeable unwanted printing artifact may be produced.

It would seem that the printing plane 27 should be placed at the image plane (in the cross-array direction) of the laser array as provided by the optical system made of lenses 16 and 18. However, in order for the final array of printing spots 26(a–e) to be straight to within at least one beam size, the diode laser array 14 must also be straight to within one beam size which is 1 micrometer over its full length of about 10 mm. This straightness is difficult to achieve due to manufacturing tolerances, and thus if the laser array 14 is imaged onto the media in the cross array direction, the array image will not be straight.

In one aspect of this invention, optical means are disclosed which effectively straighten the array of printing spots by placing the medium plane at the back focal plane 17 of the totality of the optics between the diode laser array 14 and the medium, affecting the location of the printing spots 26(a–e) in the cross-array direction as shown in FIG. 3b. FIG. 3b shows the cross-sectional view in the cross-array direction of the present embodiment. Diode laser 13b ideally would be co-linear with diode 13a. However, it is displaced in the cross array direction due to manufacturing tolerances. Because the laser beams from 13a and 13b are still substantially parallel to the optical axis 5, they cross each other at the back focal plane 17 of cylindrical lens 16 in this cross-array view. Because the beams are still separated in the array direction but coincide in the cross-array direction, they form a straight array of beam profiles at back focal plane 17. We use lens elements 18, 19, and printing lens 22 to optically conjugate back focal plane 17 to printing spots 26. In other words, the final image on printing medium 26, is the image plane of the back focal plane 17 in the cross-array direction. Since the beam array is straight at back focal plane 17, it is also straight at the printing spots 26.

An equivalent way of describing this arrangement is to say that cylindrical lens 16 and lens elements 18 and 19 and the printing lens 22 constitute a combined optical system in the cross-array direction such that the printing plane 27 should be ideally positioned at the back focal plane 17 in the cross-array direction of this combined optical system.

Note however, that the non-straightness of the array will manifest itself as a beam displacement in the entrance pupil of the printing lens 22. These displacements place an upper limit on the amount of non-straightness this optical scheme can correct.

A major problem in high power diode laser arrays is the premature failure of a diode laser. If one of the diode laser elements 13 of the present embodiment shown in FIGS. 1, 2a and 2b fails, the whole diode laser array may be rendered useless. To reduce the impairment to the diode laser array 14 by a premature failure of a diode laser element 13, the preferred embodiment shown in FIGS. 4a and 4b is disclosed in which each of the independently modulated diode laser elements 13 is made of a sub-array of diode lasers 13a–c. The first lenslet array 20 is also made as an array of sub-arrays so as to first overlap the light from the individual diode lasers in the sub-array and then to proceed as in the preferred embodiment to the intermediate image plane 30. The degradation of array performance due to a premature failure of any one or more of the diode laser elements 13 a–c in the sub-array members is reduced by first overlapping the light of the diodes of the sub-array. Thus, adequate light is provided at the printing spot 26 on the medium plane 28 by the other members of the sub-array and the loss of one or more of the sub-array members only means that the other members must operate at higher current levels to compensate for the power loss.

The preferred embodiment is shown in FIGS. 4a and 4b. FIG. 4a is a cross-sectional view of the preferred embodiment in the array direction and FIG. 4b is a cross-sectional view of the preferred embodiment in the cross-array direction. In this preferred embodiment, a different array of laser diodes 52 is used in which each of the diode laser elements 13a–c of diode laser array 14 in the first embodiment is replaced with a diode sub-array 53 of diode lasers 56 to form an array of diode lasers 52. Typically a high power array 52 will consist of 10 to 20 sub-arrays 53. In FIG. 4a, only three diode sub-arrays are shown: 53a, 53b and 53c. Each diode sub-array 53 is made of a number of diode lasers 56 all driven and modulated as an ensemble. For clarity, only two diode lasers 56 are shown in FIG. 4a in each of the sub-arrays 53a, 53b and 53c.

For each of the diode sub-arrays 53 such as 53a there is a corresponding lenslet 21. Lenslets 21 are combined to lenslet array 20. In addition, each diode laser 56 within the diode sub-array 53 has a corresponding lenslet 55. Lenslet 55 forms the lenslet array 54. Though lenslet arrays 20 and 54 are shown separately in FIG. 4a, they can be made on one surface of element 51, most likely as a binary optical component. Each diode laser 56 in the sub-array is imaged by lenslets 55 and 21 onto the intermediate image plane 30 with a certain magnification so as to produce a closely packed set of diode laser images 31. For example, the size of the diode laser 56 in the array direction is 4 micrometers, lenslet 55 focal length is 200 micrometers and the focal length of lenslet 21 is 50 mm. Diode laser 56 is magnified by a factor of 250 and the diode laser image 31 is about 1 mm in size. The rest of the system as shown on FIG. 4a, from the second lenslet array 32 at intermediate image plane 30 to the printing plane 27, is essentially the same as in the first embodiment. FIG. 4b shows the cross-sectional view of the second embodiment where the only change from the first embodiment is the addition of lenslet array 54 which has substantially no power in the cross-array direction.

Figure 5:
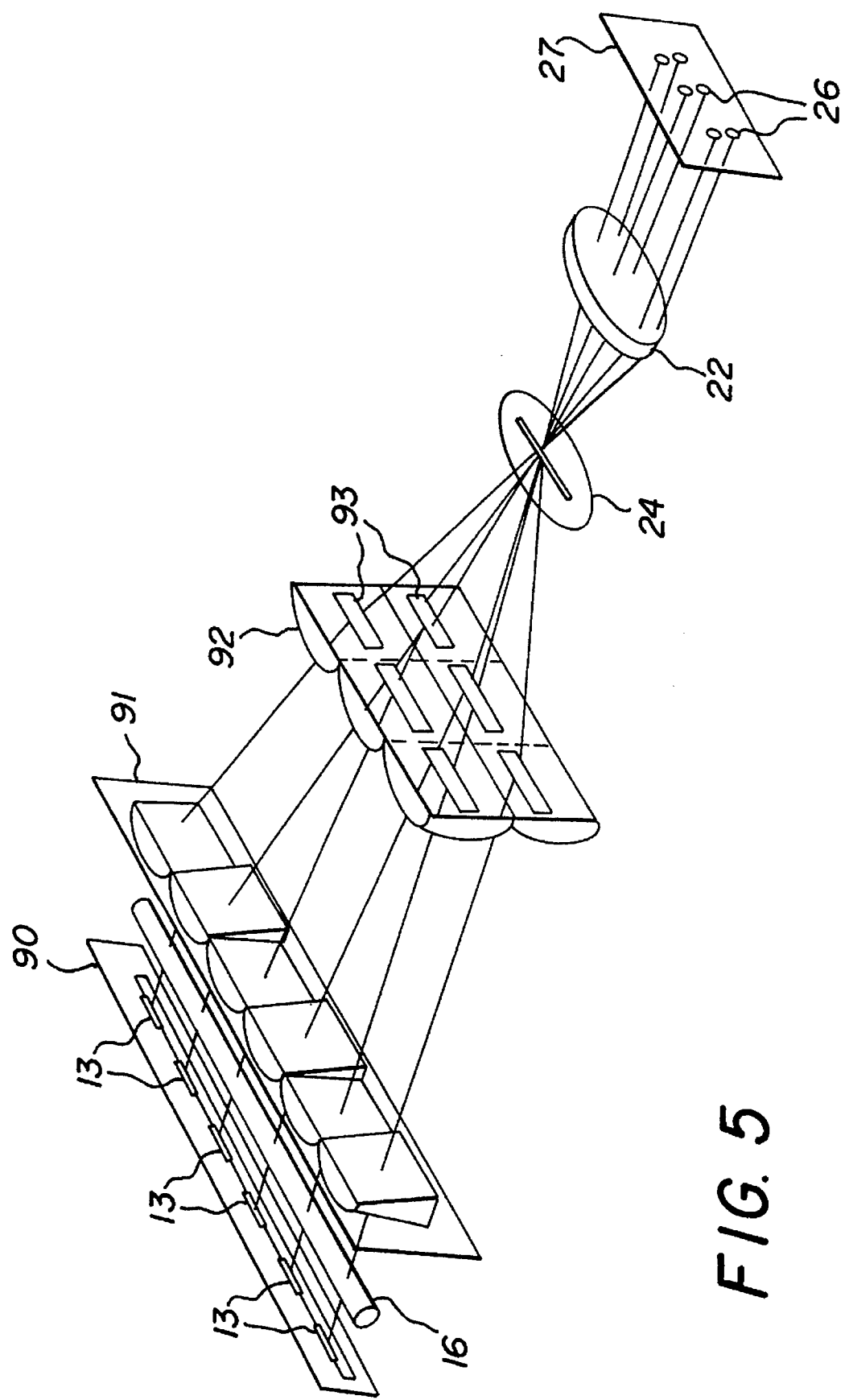
FIG. 5 illustrates the perspective view of an optical arrangement according to a third embodiment of the present invention.

FIG. 5 is a perspective view of a third embodiment in which a linear array 90 of diode laser elements 13 is converted by a lenslet array 91 into a two-dimensional array of closely packed spots 93. A second arrangement of lenslet arrays 92, co-located with spots 93, shapes and redirects the beams to the entrance pupil 24 of the printing lens 22 so as to generate a two-dimensional array of printing spots 26 in printing plane 27. This allows for more optical printing spots in the optical field of the printing lens. This second lenslet array is substantially similar to the lenslet array 32 in the previous embodiments except that lenslet array 92 also affects the beams in the cross-array direction. Though each of the diode laser elements 13 is shown as a single diode laser, they can each be a diode sub-array 53 as in the preferred embodiment. For clarity, some optical means which affect the beam in the cross-array direction such as lens elements 18 and 19 of the preferred embodiments, are not shown in FIG. 5.

Figure 6:
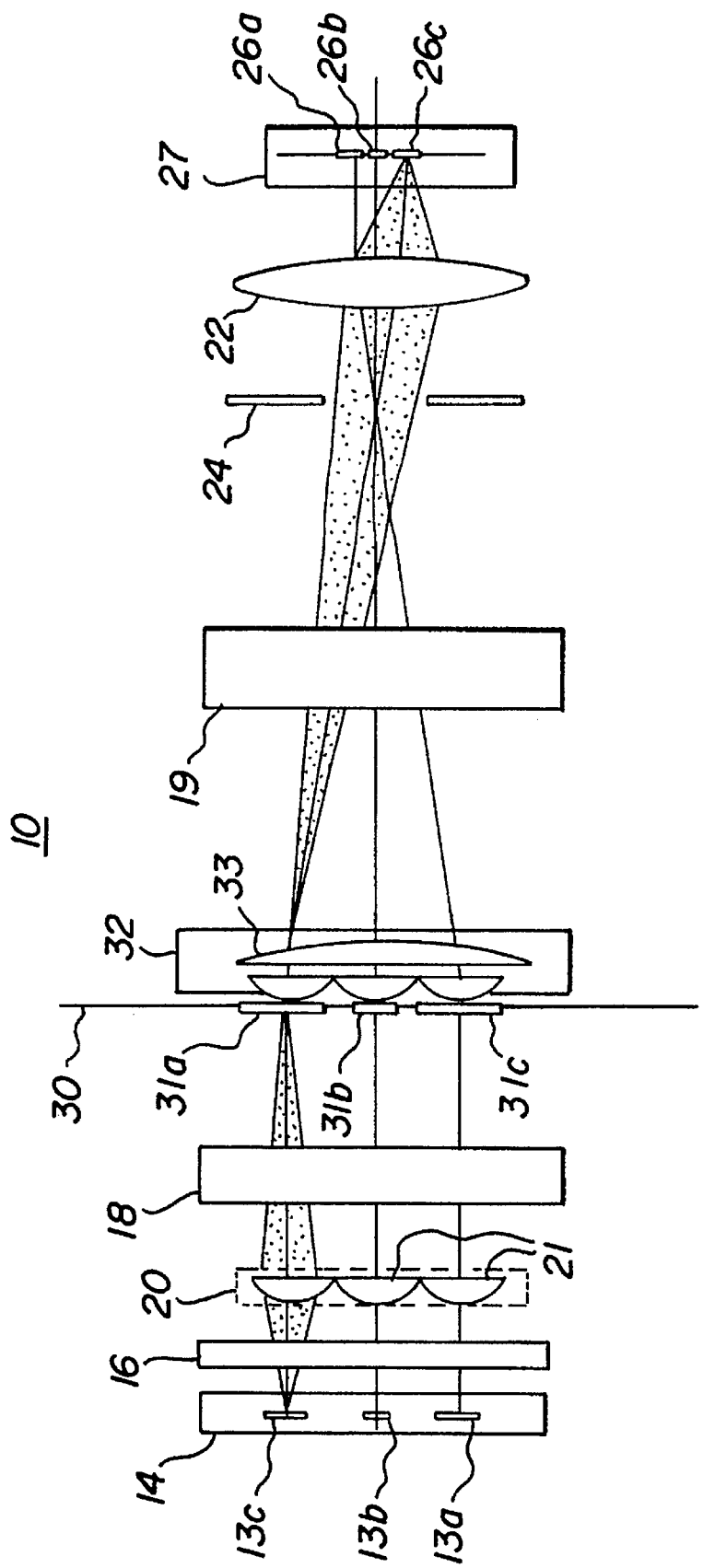
FIG. 6 illustrates the top plan view in the array direction of an optical arrangement according to a fourth embodiment of the present invention where the printing spots are two or more different sizes.

FIG. 6 shows a cross-sectional view in the array direction of still a fourth embodiment according to this invention, containing a diode laser array 14. Three of the diode laser elements 13a, 13b and 13c are shown; the diode laser elements 13 are modulated independently and are not of the same size. As shown, diode 13b is smaller than diode laser elements 13a and 13c. The first lenslet array 20 with a corresponding lenslet 21 for each of the diode laser elements 13 is used to produce a closely packed array of spots from the diode laser image at intermediate image plane 30. The spot formed by the diode laser image 31b is smaller than spots 31a and 31b. Thus, at the medium plane 28, the corresponding printing spots 26 are also of different size, spot 26b being smaller than spots 26a or 26c.

While the invention has been described in conjunction with specific embodiments thereof, it is evident that many alternatives, modifications, and variations will be apparent to those skilled in the art in light of the foregoing description. Accordingly, it is intended to embrace all such alternatives, modifications and variations as fall within the spirit and broad scope of the appended claims.

We claim:

1. A multi-beam laser printer for printing onto a light-sensitive medium comprising:

a plurality of diode lasers formed in a linear direction, each diode laser being modulated to generate a separately intensity-modulated diverging light beam;

a printing lens having an entrance pupil for forming the light beams from the linear direction which enter through the entrance pupil onto a light-sensitive medium as an array of spots;

optical means for reducing the divergence of the light beams from the plurality of diode lasers by a predetermined amount in a direction perpendicular to the linear direction, wherein the optical means comprises;

a first cylindrical lens having a first numerical aperture for collecting the diverging light beams from the linear direction, and for reducing the divergence of the beams from the linear direction by a predetermined amount; and a second cylindrical lens system comprised of at least one cylindrical lens to further shape the beam and for collecting the light beam from the first cylindrical lens, for additional shaping of the light beams, and for continuing the direction of the light beams into the entrance pupil of the printing lens;

a first lenslet array having a separate lenslet associated with each light beam for directing the associated light beams in the linear direction towards an object plane of the printing lens to form a more uniform distribution of light in the linear direction; and a second lenslet array spaced from the first lenslet array for imaging the first lenslet array into the entrance pupil of the printing lens in the linear direction.

2. The multi-beam laser printer of claim 1 wherein the first cylindrical lens of the optical means is a fiber optic placed parallel to the linear direction.

3. The multi-beam laser printer of claim 1 wherein the optical means together with the printing lens constitute a subsystem perpendicular to the linear direction with the laser direction at a front focal plane of this system and the light-sensitive medium at a back focal plane of this subsystem so that any deviation from the straightness of the laser direction perpendicular to the linear direction is corrected, so that the array forms a straight line at the light-sensitive medium.

4. The multi-beam laser printer of claim 1 wherein at least one of the lenslet arrays is a binary optics lenslet array.

5. The multi-beam laser printer in claim 1 in which each of the diode lasers have an emitting aperture which are not all of the same size in the linear direction to achieve an array of printing spots at the light-sensitive medium which are not all of equal size.

6. The multi-beam laser printer in claim 1 in which the linear direction of diode lasers is converted by the two lenslets arrays into a two-dimensional array of printing spots at the light-sensitive medium.

7. A multi-beam laser printer onto a light-sensitive medium comprising:

a plurality of diode lasers in a diode laser array in a single direction formed into a plurality of sub-arrays of separated diode lasers with each sub-array generating a separate intensity modulated set of diverging light beams;

a printing lens having an entrance pupil for forming the light beams from the diode laser array which enter through a center of the entrance pupil onto a light sensitive medium in the form of an array of spots at its object plane;

optical means for reducing the divergence of the light beams from the plurality of diode lasers by a predetermined amount, and for continuing a propagation of the light beams into the entrance pupil of the printing lens;

a first lenslet array having a plurality of lenslet sub-arrays such that each lenslet sub-array corresponds to a sub-array of diode lasers, each lenslet sub-array directing each of the light beams from the corresponding diode laser sub-array towards the object plane of the printing lens such that all the beams from the individual diode lasers in the sub-array overlap in the single direction of the array at the object plane of the printing lens and such that the spots from the different sub-arrays form an array of spots in a single direction at this plane with a higher percentage of the object plane being illuminated in the single direction of the array; and a second lenslet array in the vicinity of the object plane of the printing lens for imaging the first lenslet array into the entrance pupil of the printing lens in the array direction.

8. The multi-beam laser printer of claim 7 wherein the optical means comprises:

a first cylindrical lens having a first numerical aperture for collecting the diverging light beams from the diode laser array, and for reducing divergence of the beams from the diode laser array by a predetermined amount; and a second cylindrical lens system comprised of at least one cylindrical lens for additional shaping of the beam for collecting the light beam from the first cylindrical lens, and for further shaping of the light beams, and for continuing the propagation of the light beams into the entrance pupil of the printing lens.

9. The multi-beam laser printer of claim 7 wherein the optical means together with the printing lens constitute a subsystem perpendicular to the array direction with the laser array at the front focal plane of this system and the light-sensitive medium at the back focal plane of this subsystem so that any deviation from the straightness of the laser array in the direction perpendicular to the single direction of the laser array is corrected and a straight line of printing spots is produced at the light-sensitive medium.

10. The multi-beam laser printer of claim 7 wherein at least one of the lenslet arrays is a binary optics lenslet array.

11. A method of using multi-beam light sources to print onto a light-sensitive medium, said method comprising the steps of:

generating a plurality of separately intensity modulated diverging light beams;

forming the light beams through an opening of an entrance pupil of a printing lens having an object plane onto a light-sensitive medium as a single direction array of spots of predetermined intensities;

reducing the divergence of the light beams by a predetermined amount;

directing each of the light beams in the single direction of the array toward the object plane of said printing lens to form a more uniform distribution of light in the single direction of the array; and directing an image on said object plane into the entrance pupil of the printing lens in the single direction of the array.

* * * * *